United States Patent
Gupta et al.

(10) Patent No.: US 7,707,466 B2
(45) Date of Patent: Apr. 27, 2010

(54) SHARED LATCH FOR MEMORY TEST/REPAIR AND FUNCTIONAL OPERATIONS

(75) Inventors: Ravi Gupta, Austin, TX (US); Robert L. Bailey, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 468 days.

(21) Appl. No.: 11/678,258

(22) Filed: Feb. 23, 2007

(65) Prior Publication Data

US 2008/0209283 A1    Aug. 28, 2008

(51) Int. Cl.
G11C 29/00 (2006.01)
G01R 31/28 (2006.01)
G01R 31/26 (2006.01)

(52) U.S. Cl. ............ 714/718; 714/710; 714/711; 714/726; 714/729; 365/201; 324/527; 324/763; 324/765

(58) Field of Classification Search ............ 714/710, 714/711, 718, 726, 729; 365/201; 324/527, 324/763, 765
See application file for complete search history.

(56) References Cited

U.S. PATENT DOCUMENTS

| | | | | |
|---|---|---|---|---|
| 4,475,194 | A * | 10/1984 | LaVallee et al. | 714/710 |
| 5,592,493 | A * | 1/1997 | Crouch et al. | 714/729 |
| 5,677,917 | A * | 10/1997 | Wheelus et al. | 714/726 |
| 6,549,478 | B2 * | 4/2003 | Suzuki | 365/201 |
| 6,577,156 | B2 * | 6/2003 | Anand et al. | 326/37 |
| 6,622,273 | B1 * | 9/2003 | Barnes | 714/733 |
| 6,954,399 | B2 | 10/2005 | Park | |
| 6,993,692 | B2 | 1/2006 | Ouellette et al. | |
| 7,028,238 | B2 * | 4/2006 | Korger et al. | 714/727 |
| 7,031,866 | B1 * | 4/2006 | Behera et al. | 702/117 |
| 7,152,187 | B2 * | 12/2006 | Tran et al. | 714/42 |
| 7,162,673 | B2 * | 1/2007 | Wong | 714/726 |
| 7,174,486 | B2 * | 2/2007 | Adams et al. | 714/710 |
| 7,490,276 | B1 * | 2/2009 | White et al. | 714/718 |
| 7,502,976 | B2 * | 3/2009 | Ross et al. | 714/718 |
| 2005/0041492 | A1 | 2/2005 | Kim | |
| 2006/0083087 | A1 | 4/2006 | Cowles et al. | |
| 2006/0179377 | A1 | 8/2006 | Dawson et al. | |
| 2008/0065929 | A1 * | 3/2008 | Nadeau-Dostie et al. | 714/5 |
| 2008/0316850 | A1 * | 12/2008 | Penzes | 365/228 |

FOREIGN PATENT DOCUMENTS

DE    EP 805451 A2 * 11/1997

* cited by examiner

Primary Examiner—John J Tabone, Jr.

(57) ABSTRACT

A memory device includes a latch component including a first input configured to receive a functional data bit associated with a functional operation, a second input configured to receive a memory test/repair data bit associated with a memory test operation, and a latch comprising a data input and a data output and select logic configured to selectively connect one of the first input or the second input to the data input of the latch based on a mode of operation of the memory device. A method includes operating a memory device in a first mode associated with a memory test operation and in a second mode associated with a functional operation. The method further includes storing a memory test/repair data bit at a latch component of the memory device in the first mode and storing a functional data bit at the latch component in the second mode.

18 Claims, 3 Drawing Sheets

SHARED LATCH FOR MEMORY TEST/REPAIR AND FUNCTIONAL OPERATIONS

FIELD OF THE DISCLOSURE

The present disclosure relates generally to memory devices and more particularly to memory test and repair techniques.

BACKGROUND

Many memory devices utilize memory built-in self-test (BIST) techniques whereby some or all of the memory storage locations are analyzed by embedded circuitry to identify faulty memory storage locations. Repair information regarding the faulty memory storage locations (e.g. the addresses of the faulty memory storage locations) is stored in a set of latches dedicated to the storage of test information only. The repair information then can be retrieved from these dedicated latches for the purpose of repairing the faulty memory storage locations, such as by rerouting the corresponding address to a back-up memory storage location. However, as the storage capacity of memory devices increases, so does the number of dedicated latches needed to store the test information. This increase in the number of latches dedicated to storing memory test information has resulted in a corresponding increase in the size, complexity, and cost of conventional memory devices.

In an effort to reduce the number of dedicated latches, some memory devices divide their memory arrays into separate regions for testing and run multiple passes of the test process. After each pass, the repair information for the tested region is shifted out for the next test pass, thereby reducing the size of the repair information for each pass, and thus the number of dedicated latches needed to store the repair information. However, this technique is complex and inefficient due to the repetition of the test process. As an alternate technique, some memory devices utilize a compression engine to compress the test information to fit into a smaller number of dedicated latches. However, like other conventional solutions, the implementation of the compression engine increases the complexity of the memory device and reduces the performance of the test process. Accordingly, an improved technique for storing test information for memory test and repair purposes would be advantageous.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

Figure 1:
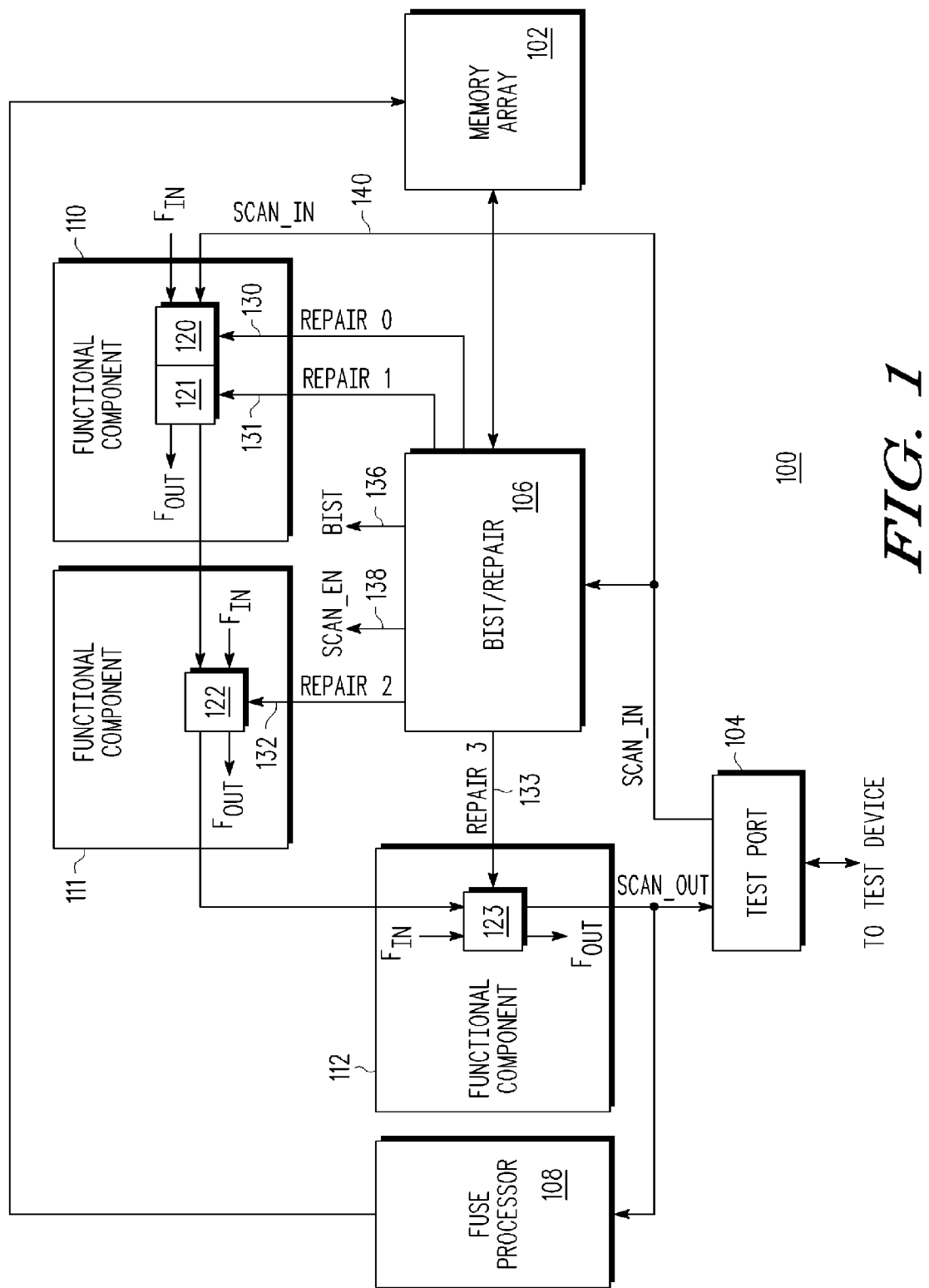
FIG. 1 is a block diagram illustrating an example memory device utilizing bimodal latch components in accordance with at least one embodiment of the present disclosure.

In accordance with one aspect of the present disclosure, a method includes operating a memory device in a first mode associated with a memory test operation and in a second mode associated with a functional operation. The method further includes storing a memory test/repair data bit at a latch component of the memory device in the first mode. The memory test/repair data bit is associated with a memory storage location of the memory device tested as part of the memory test operation. The method additionally includes storing a functional data bit at the latch component in the second mode. The first functional data bit associated with the functional operation.

In accordance with another aspect of the present disclosure, a memory device is provided. The memory device includes a latch component comprising a first input configured to receive a functional data bit associated with a functional operation of the memory device and a second input configured to receive a memory test/repair data bit associated with a memory test operation of the memory device. The latch component further includes a latch comprising a data input and a data output and select logic configured to selectively connect one of the first input or the second input to the data input of the latch based on a mode of operation of the memory device.

In accordance with yet another aspect of the present disclosure, a method includes providing a memory device comprising a latch component having a first input coupleable to a functional component of the memory device, a second input coupleable to a memory repair component, and a latch. The method further includes configuring the memory device to store a functional data bit from the functional component at the latch during a functional mode of the memory device. The method additionally includes configuring the memory device to store a memory test/repair data bit from the memory repair component at the latch during a memory test mode of the memory device.

FIGS. 1-4 illustrate example techniques for storing memory test information for use in, for example, repairing failing memory. In at least one embodiment, one or more bimodal latch components are utilized to store either memory test/repair data related to a memory test operation or functional data related to a functional operation, depending on a mode of the memory device. Thus, latch components used for functional operations that otherwise would be idle during memory test operations can be reused for memory test operations, and vice versa, thereby requiring fewer latch components than a conventional memory architecture utilizing latches dedicated to storing only memory test information.

The term "memory test operation" and its variants, as used herein, refer to an operation of a memory device for the purpose of identifying one or more faulty, or potentially faulty, memory storage locations of the memory device. The term "memory test/repair data" and its variants, as used herein, refer to data generated by, or otherwise associated with, a memory test operation, a memory repair operation, or a combination thereof. The term "functional operation" and its variants, as used herein, refer to an operation of a memory device other than the purpose of identifying one or more faulty, or potentially faulty, memory storage locations of the memory device. The term "functional data" and its variants, as used herein, refer to data generated by, or otherwise associated with, a functional operation.

FIG. 1 illustrates an example memory device 100 in accordance with at least one embodiment of the present disclosure. In the depicted embodiment, the memory device 100 includes a memory array 102, a test port 104, a built-in self-test (BIST)/repair module 106, a fuse processor 108, and a plurality of functional components, such as functional components 110, 111, and 112 (hereinafter, "functional components 110-112").

The memory array 102 includes a plurality of memory storage locations arranged in, for example, a matrix of columns and rows accessed via row and column drivers (not shown). The test port 104 includes any of a variety of test ports utilized by an external test device, such as, for example, a test port substantially compliant with the Institute of Electrical and Electronic Engineers (IEEE) 1149.1 standard (also known as the Standard Test Access Port and Boundary-Scan Architecture or the JTAG standard). The fuse processor 108 can include any of a variety of fuse mechanisms (e.g., a fuse array) for rerouting memory addresses mapped to a faulty memory storage location to an alternate storage location as known in the art. In one embodiment, the fuse processor 108 includes a processor and related circuitry that selects fuses to blow so as to reroute from faulty memory locations. In an alternate embodiment, select fuses can be blown manually to repair the memory based on the test/repair data.

The functional components 110-112 can include any of a variety of logic-based functional components to implement functional operations of the memory device 100. Examples of the functional components 110-112 can include, for example, adders, multipliers, encoders, decoders, and the like. Each of the functional components 110-112 includes one or more bimodal latch components configurable to store either functional data associated with a functional operation performed at the corresponding functional component, or memory test/repair data associated with a memory test operation performed at the memory device 100. Further, in one embodiment, the bimodal latch components are configurable to form at least part of one or more scan chains accessible via, for example, the test port 104. In the illustrated example, the functional component 110 includes a bimodal latch component 120 and a bimodal latch component 121, the functional component 111 includes a bimodal latch component 122, and the functional component 112 includes a bimodal latch component 123. As illustrated in greater detail herein, in one embodiment each of the bimodal latch components 120, 121, 122, and 123 (hereinafter, "bimodal latch component 120-123") includes an input (Fin) to receive functional data, an output (Fout) to provide latched functional data, and an input configured to receive memory test/repair data (illustrated as signals 130, 131, 132, and 133, respectively). Each of the bimodal latch components 120-123 also further can include an input connectable to the previous stage of a scan chain and an output connectable to the next stage of the scan chain. For example, as illustrated in FIG. 1, the bimodal latch components 120-123 can be connected in sequence to form a scan chain accessible via the test port 104, whereby a scan chain input signal (scan_in signal 140) and a scan chain output signal (scan_out signal 142) can be communicated with an external test device via the test port 104 or via the BIST/repair module 106. Alternately, the bimodal latch components 120-123 can be mapped for access via the test port 104. Each of the bimodal latch components 120-123 further can include inputs to receive control signals, such as a BIST signal 136 and a scan_en signal 138, to configure a mode of the bimodal latch component. Further, although a relatively small number of bimodal latch components are illustrated for purposes of clarity, it will be appreciated that hundreds, thousands, or millions of bimodal latch components may be used in a device implementation.

When in a memory test mode, the BIST/repair module 106, in one embodiment, is configured to perform a memory test operation to test some or all of the memory storage locations of the memory array 102 to identify those memory storage locations that are faulty (or likely faulty). The BIST/repair module 106 can be configured to perform any of a variety of memory test methods known to those skilled in the art, such as a checkerboard test, a walking bit test, a read/write recovery test, and the like. The BIST/repair module 106 also can configure the relevant control signals, e.g., the BIST signal 136 and the scan_en signal 138, to configure the bimodal latch components 120-123 for the memory test mode. In one embodiment, the BIST signal 136 represents whether the memory device 100 is in a memory test mode or a functional mode, and the scan_en signal 138 represents whether the bimodal latch components 120-123 are configured to operate as a scan chain.

As the memory test operation progresses, information generated from the memory test operation is stored at the bimodal latch components 120-123 as memory test/repair data. The memory test/repair data can include, for example, a series of bits representing a serial list of the memory addresses of faulty memory storage locations identified by the BIST/repair module 106. Other formats of the memory test/repair data can be utilized without departing from the scope of the present disclosure.

In one embodiment, the BIST/repair module 106 includes an output mapped to each bimodal latch component and a bit of the memory test/repair data is stored to a bimodal latch via the corresponding output of the BIST/repair module 106. To illustrate, the BIST/repair module 106 includes repair signals 130, 131, 132, and 133 connected to bimodal latch components 120-123, respectively, whereby the BIST/repair module stores one bit of the memory test/repair data to the bimodal latch component 120 via the repair signal 130, the next bit of the memory test/repair data to the bimodal latch component 121 via the repair signal 131, the third bit of the memory test/repair data to the bimodal latch component 122 via the repair signal 132, and the fourth bit of the memory test/repair data to the bimodal latch component 123 via the repair signal 133. In an alternate embodiment, the BIST/repair module 106 includes an output through which the BIST/repair module 106 can scan the memory test/repair data into the scan chain formed by the bimodal latch components 120-123.

When the memory device 100 is in a functional mode, the BIST/repair module 106 configures the control signals, e.g., the BIST signal 136 and the scan_en signal 138, so as to configure the bimodal latch components 120-123 to store functional data generated as a result of the functional operations performed by the functional components 110-112. The functional data (e.g., a bit) to be stored at a bimodal latch component is received via its functional input (Fin), which is connected to other functional circuitry of the same functional component or other functional component. Likewise, the functional data latched at the bimodal latch component is provided via its functional output (Fout), which is connected to other functional circuitry of the same functional component or other functional component.

As illustrated by FIG. 1, the latch components that otherwise would be idle during a memory test mode to store memory test/repair data facilitates the implementation of fewer latch components at the memory device 100 compared to memory devices that utilize latch components dedicated to storing functional data only and separate latch components dedicated to storing memory test/repair data only.

Figure 2:
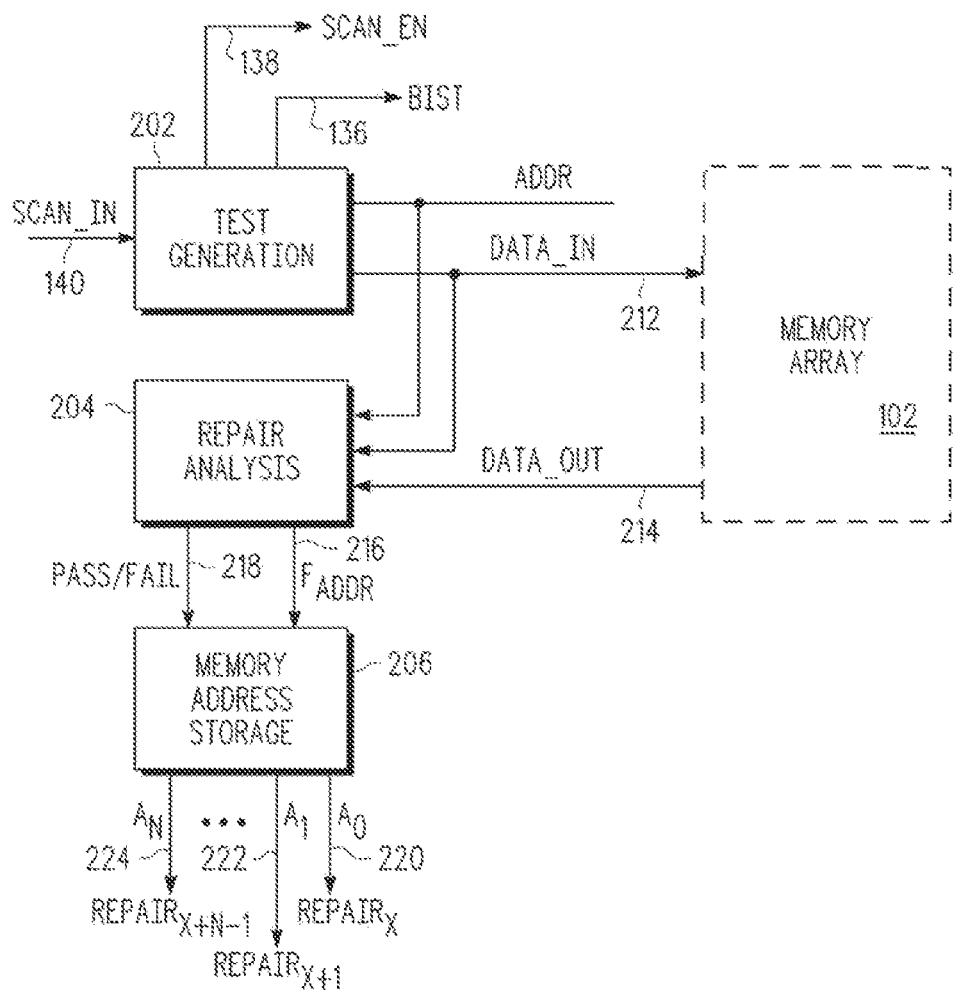
FIG. 2 is a block diagram illustrating an example BIST/repair module of the memory device of FIG. 1 in accordance with at least one embodiment of the present disclosure.

FIG. 2 illustrates an example implementation of the BIST/repair module 106 in accordance with at least one embodiment of the present disclosure. In the depicted embodiment, the BIST/repair module 106 includes a test generation module 202, a repair analysis module 204, and a memory address storage module 206. The modules 202, 204, and 206, in one embodiment, are implemented as logic circuitry implemented at, or associated with, the memory device 102.

The test generation module 202, in one embodiment, includes outputs to provide the BIST signal 136 and the scan_en signal 138, an output connected to the memory array 102 (e.g., connected to an input of a row/column driver) to provide a memory address (ADDR) value 210 and an output connected to the memory array 102 to provide an input data (DATA_IN) value 212. The repair analysis module 204 includes an input to receive the ADDR value 210, an input to receive the DATA_IN value 212, and an input to receive an output data value (DATA_OUT) value 214, which may be the same as, or different from, the DATA_IN value 212 depending on whether the memory storage location is faulty. The repair analysis module 204 further includes an output to provide an address value for a faulty memory storage location (FADDR value 216) and an output to provide a pass/fail indicator 218 that serves to indicate whether the memory storage location tested is faulty or not. The memory address storage module 206 includes inputs to receive the FADDR value 216 and the pass/fail indicator 218, and a plurality of outputs, each output coupled to a corresponding bimodal latch component (e.g., bimodal latch components 110-112) of the memory device 100. Alternately, in one embodiment the memory address storage module 206 includes an output coupled to the initial bimodal latch component of a scan chain of bimodal latch components.

In memory test mode, the BIST/repair module 106 performs a memory test operation whereby each memory storage location of at least a portion of the memory array 102 is tested by writing a test value (DATA_IN value 212) to the memory storage location and then reading the memory storage location to verify that the value read from the memory storage location (DATA_OUT value 214) is the same as the value written to the storage location. As part of the memory test operation for a given memory storage location, the test generation module 202, in one embodiment, is configured to write the DATA_IN value 212 to the memory storage location of the memory array 102 associated with ADDR value 210. The repair analysis module 204 then accesses the memory storage location of the memory array and reads the DATA_OUT value 214 from the memory storage location. In the event that the DATA_IN value 212 and the DATA_OUT value 214 do not match (i.e., the memory storage location is faulty), the repair analysis module 204 provides a portion or all of the ADDR value 210 as the FADDR value 216 and places the pass/fail indicator 218 in a first state (e.g., an asserted state), thereby indicating that the memory storage location associated with the FADDR value 216 is faulty. Otherwise, if the DATA_OUT value 214 matches the DATA_IN value 212 (i.e., the memory storage location is presumed reliable), the repair analysis module 204 places the pass/fail indicator 218 in a second state (e.g., a deasserted state), thereby indicating the memory storage location is not faulty. In response to the pass/fail indicator 218 having the first state, the memory address storage module 206 latches the FADDR value 216. The memory address storage module 206 then distributes each bit of at least a portion of the FADDR value 216 to a corresponding bimodal latch component for storage. Each of the bits of the FADDR value 216 may be individually distributed via, e.g., a mapping from the memory address storage module 206, or the bits may be distributed in sequence by scanning the bits of the FADDR value 126 into a scan chain formed by the bimodal latch components. This process of testing a memory storage location and then storing an address value for memory storage locations identified as faulty can be iterated for some or all of the memory storage locations of the memory array 102.

The ADDR value 210 and the DATA_IN value 212 can be predetermined prior to testing (e.g., by writing to a corresponding register, by fusing the values, etc.) or the ADDR value 210 and the DATA_IN value 212 can be provided during testing via, e.g., the test port 104 as the scan_in signal 140. Further, in response to a stimulus indicating that a memory test mode is to be entered (e.g., via a signal provided by an external test device), the test generation module 202 places the BIST signal 136 in a first state (e.g., an asserted state), thereby configuring the memory device 100 in preparation for the memory test mode. Conversely, when the BIST/repair module 106 exits a memory test mode, the test generation module 202 places the BIST signal 136 in a second state (e.g., a deasserted state) so as to configure the memory device 100 for normal operation. Likewise, when the test generation module 202 receives a stimulus indicating that an external test device is to utilize the scan chain formed by the bimodal latch components 110-112, the test generation 202 can place the scan_en signal 138 in an asserted state so as to configure the bimodal latch components 110-112 to operate as elements of the scan chain.

Figure 3:
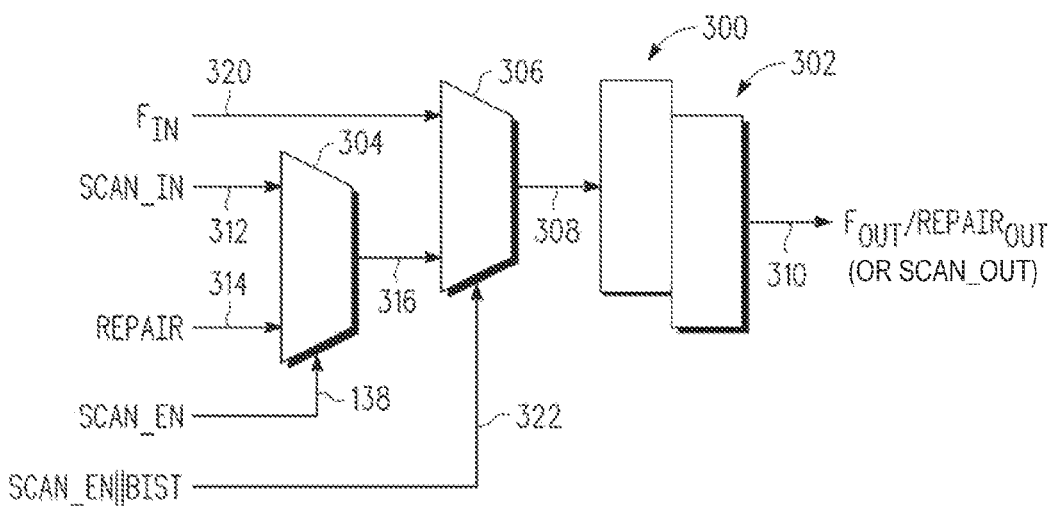
FIG. 3 is a block diagram illustrating an exemplary bimodal latch component in accordance with at least one embodiment of the present disclosure.

FIG. 3 illustrates an example bimodal latch component 300 in accordance with at least one embodiment of the present disclosure. The depicted bimodal latch component 300 represents one implementation of, for example, the bimodal latch components 120-123 of FIG. 1.

As illustrated, the bimodal latch component 300 includes a bit latch 302 (which can include any of a variety of clocked memory storage elements) and selection logic, such as a multiplexer 304 and a multiplexer 306. The bit latch 302 includes an input to receive a bit input signal 308 and an output to provide a latched bit signal 310, whereby the bit latch 302 is configured to latch the bit value of the bit input signal 308 for output as the latched bit value for the latched bit signal 310. When in a functional mode, the latched bit signal 310 serve as the functional output (Fout) for receipt by other functional circuitry. When in a memory test mode, the latched bit signal 310 serves as the input (repair$_{out}$) to the next stage of a scan chain formed by a sequence of bimodal latch components 300 for the sequential storage of bits representative of memory test/repair data (e.g., address values of faulty memory storage locations).

The multiplexer 304 includes an input to receive a scan_in signal 312, an input to receive a repair signal 314, and an output to provide a select one of the scan_in signal 312 or the repair signal 314 as a non-functional data signal 316 based on the scan_en signal 138. When the scan_en signal 138 is in an asserted state to enable the scan chain of which the bimodal latch component is part, the multiplexer 304 provides the value of the scan_in signal 312 as the non-functional data signal 316. Otherwise, the multiplexer 304 provides the value of the repair signal 314. The scan_in signal 312 can represent scan_in signal 140 of FIG. 1, either initially from the test port 104 or from another bimodal latch component prior to in the scan chain. The repair signal 314 can represent, when in memory test mode, the memory test/repair data bit (e.g., a bit of a memory address of a faulty memory storage location)

provided by the memory address storage module 206 for storage at the bimodal latch component 300.

The multiplexer 306 includes an input to receive a functional data signal 320 from functional circuitry, an input to receive the non-functional data signal 316, and an output to provide a select one of the functional data signal 320 or the non-functional data signal 316 as the bit input signal 308 to the bit latch 302 based on a select signal 322. When the select signal 322 is in a first state (e.g., asserted), the multiplexer 306 provides the value of the non-functional data signal 316 as the bit input signal 308. Otherwise, when the select signal 322 is in a second state (e.g., deasserted), the multiplexer 306 provides the value of the functional data signal 320 as the bit input signal 308. In at least one embodiment, the select signal 322 represents a logical OR operation between the scan_en signal 138 and the BIST signal 136 (e.g., scan_en || BIST).

As illustrated by FIG. 3, the multiplexers 304 and 306 operate as selection logic to select between functional data, scan chain data, and memory test/repair data (whereby the scan chain data can include memory test/repair data from another bimodal latch component when in scan chain mode). The multiplexer 304 operates to select between potential scan chain data (scan_in signal 312) and potential memory test/repair data (repair signal 314) depending on whether the bimodal latch components 300 of the memory device are enabled to enter a scan chain mode. Thus, the output of the multiplexer 304 is non-functional data associated with memory test operations, rather than functional operations of the memory device. Further, the multiplexer 306 operates to select between functional data (i.e., from other functional circuitry) and the non-functional data (scan chain data or memory test/repair data) based on whether the memory device is in a scan chain enabled mode, a memory test mode (e.g., a built-in self-test mode), or a functional mode. Thus, in a scan chain mode (as indicated by an asserted scan_in signal 312), the multiplexers 304 and 306 select and provide the input scan chain data (which can include memory test/repair data) for storage at the bit latch 302. In a memory test mode, the multiplexers 304 and 306 select and provide the memory test/repair data (repair signal 314) for storage at the bit latch 302. In a functional mode, the multiplexers 304 and 306 select and provide functional data for storage at the bit latch 302.

Although the illustrated implementation facilitates the use of the bit latch 302 for storing both functional data and memory test/repair data, as well as operating as an element of a scan chain, this implementation does not introduce any additional delays into the functional path beyond those present in latches that enable scan chains. To illustrate, a conventional latch component typically would implement a multiplexer to select between scan chain data and functional data. Thus, these conventional implementations introduce a delay due to this multiplexer. The illustrated implementation of FIG. 3, like these conventional implementations, also has only one multiplexer delay in the functional path between the functional data signal 320 and the data latch 302. Thus, while the use of the multiplexer 304 in FIG. 3 to select between scan chain data and memory test/repair data introduces two multiplexer delays during a scan chain mode or memory test mode, it will be appreciated that the two multiplexer delays occur in the non-functional data path, which typically is not as critical a path as the functional data path and thus does not significantly detract from acceptable operation of the memory device 100.

Figure 4:
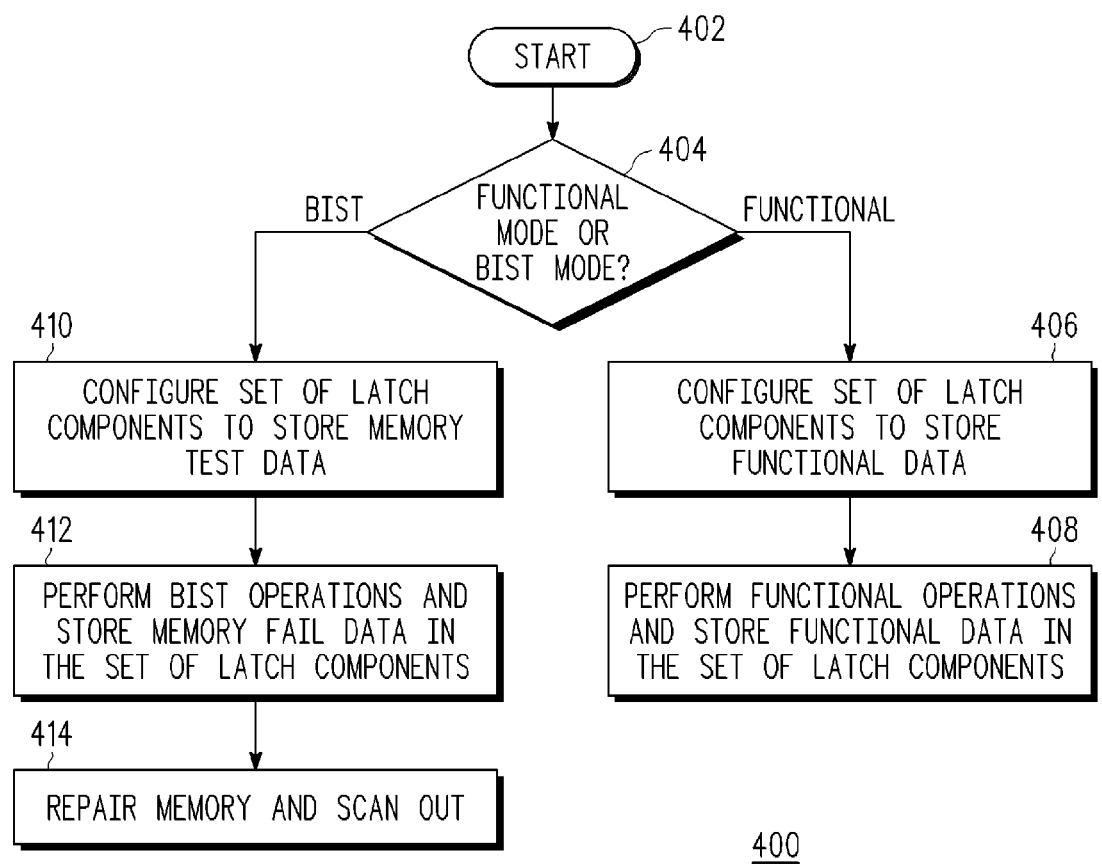
FIG. 4 is a flow diagram illustrating an exemplary method for bimodal use of a latch component in accordance with at least one embodiment of the present disclosure.

FIG. 4 illustrates an example method 400 for using a set of latch components for both functional data and memory test/repair data in accordance with at least one embodiment of the present disclosure. For ease of discussion, the method 400 is described in the context of the memory device 100 of FIGS. 1-3.

The method 400 initiates at block 402 whereby the memory device 100 enters a mode of operation. At block 404, the mode of operation is identified. The mode may be identified based on signaling from an external test device, based on the status of a particular control bit, and the like. In the event that the mode of operation is identified as a functional mode, at block 406 the set of latch components (e.g., bimodal latch components 110-112) are configured to store functional data (e.g., by deasserting the BIST signal 136 and the scan_en signal 138). At block 408, one or more functional operations are performed at the memory device 100 and functional data generated as a result of these functional operations is stored in the set of latch components.

In the event that the mode of operation is identified as a memory test mode (e.g., a BIST mode to determine and store memory test/repair data or a scan chain mode to scan out the memory test/repair data), at block 410 the set of latch components (e.g., bimodal latch components 110-112) are configured to store memory test/repair data (e.g., by asserting the BIST signal 136 and deasserting the scan_en signal 138). At block 412, one or more memory test operations are performed at the memory device 100 and the memory test/repair data (e.g., address values of faulty memory storage locations) generated as a result of these memory test operations is stored in the set of latch components. At block 414, the memory device 100 can be repaired by rerouting memory addresses from the faulty memory storage locations identified in the stored memory test/repair data to alternate memory storage locations. Further at block 414, the scan_en signal 136 can be asserted, thereby enabling the set of latch components to be used as a scan chain and an external test device can scan out the memory test/repair data from the set of latch components via the test port 104.

In this document, relational terms such as "first" and "second", and the like, may be used solely to distinguish one entity or action from another entity or action without necessarily requiring or implying any actual such relationship or order between such entities or actions. The terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

The term "another", as used herein, is defined as at least a second or more. The terms "including", "having", or any variation thereof, as used herein, are defined as comprising. The term "coupled", as used herein with reference to electro-optical technology, is defined as connected, although not necessarily directly, and not necessarily mechanically.

The terms "assert" or "set" and "negate" (or "deassert" or "clear") are used when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

As used herein, the term "bus" is used to refer to a plurality of signals or conductors that may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

Other embodiments, uses, and advantages of the disclosure will be apparent to those skilled in the art from consideration of the specification and practice of the disclosure disclosed herein. The specification and drawings should be considered exemplary only, and the scope of the disclosure is accordingly intended to be limited only by the following claims and equivalents thereof.

What is claimed is:

1. A method comprising:
    providing a memory device comprising a plurality of functional components, the plurality of functional components comprising a plurality of latch components;
    in a first mode, performing one or more functional operations using the functional components and storing functional data associated with the one or more functional operations at the plurality of latch components;
    in a second mode:
        performing a memory test operation for the memory device to determine memory test/repair data, the memory test/repair data comprising a series of bits representing a serial list of memory addresses of faulty memory storage locations of the memory device that are identified during the memory test operation; and
        storing each bit of the memory test/repair data at a corresponding latch component of the plurality of latch components in parallel;
    configuring the plurality of latch components into a scan chain and using the scan chain to access the memory test/repair data; and
    repairing the memory device using the memory test/repair data accessed from the scan chain.

2. The method of claim 1, further comprising:
    accessing the memory test/repair data from the plurality of latch components via an external test port.

3. The method of claim 1, wherein storing the memory test/repair data at the plurality of latch components comprises configuring the plurality of latch components to store the memory test/repair data in response to a control signal having a first state.

4. The method of claim 3, wherein storing the functional data at the plurality of latch components comprises configuring the plurality of latch components to store the functional data in response to the control signal having a second state.

5. The method of claim 1, wherein storing the memory test/repair data at the plurality of latch components comprises:
    configuring the plurality of latch components into a scan chain; and
    scanning the memory test/repair data into the scan chain.

6. The method of claim 1, wherein repairing the memory device using the memory test/repair data comprises rerouting memory addresses associated with the faulty memory storage locations to alternate memory storage locations.

7. The method of claim 6, wherein repairing the memory device further comprises repairing the memory device using a fuse processor of the memory device.

8. The method of claim 1, further comprising:
    configuring the plurality of latch components into a scan chain and scanning out the memory test/repair data to an external device via an external test port of the memory device.

9. A memory device comprising:
    a plurality of functional components comprising a plurality of latch components, the plurality of functional components to store functional data in the plurality of latch components during a functional mode of the memory device;
    a test generation module to perform a memory test operation for the memory device; and
    a repair analysis module to determine memory test/repair data based on the memory test operation, the memory test/repair data comprising a series of bits representing a serial list of memory addresses of faulty memory storage locations of the memory device that are identified during the memory test operation;
    a memory address storage module to store the memory test/repair data at the plurality of latch components during a test mode of the memory device the memory address storage module comprising a plurality of outputs, each output mapped to an input of a corresponding latch component, and wherein the memory address storage stores the memory test/repair data by storing, in parallel, each bit of the memory test/repair data to a corresponding latch component via a corresponding output of the plurality of outputs; and
    the repair analysis module further to configure the plurality of latch components into a scan chain and use the scan chain to access the memory test/repair data during the test mode of the memory device, and to repair the memory device using the memory test/repair data accessed from the scan chain.

10. The memory device of claim 9, wherein each latch component of the plurality of latch components comprises:
    a first input configured to receive a corresponding functional data bit of the functional data;
    a second input configured to receive a corresponding memory test/repair data bit of the memory test/repair data;
    a latch comprising a data input and a data output; and
    select logic configured to selectively connect one of the first input or the second input to the data input of the latch based on a mode of operation of the memory device.

11. The memory device of claim 10, wherein the select logic comprises:
    a multiplexer comprising an input coupled to the first input, an input coupled to the second input, an input configured to receive a control signal, and an output.

12. The memory device of claim 10, wherein the plurality of latch components is configurable into a scan chain, and wherein each latch component of a subset of the plurality of latch components further comprises:
    a third input coupled to the data output of the latch of a previous latch component in the scan chain; and
    wherein the select logic is configured to selectively connect one of the first input, the second input, or the third input to the data input of the latch based on the mode of operation of the memory device.

13. The memory device of claim 12, wherein the select logic comprises:

a first multiplexer comprising an input coupled to the second input, an input coupled to the third input, an input configured to receive a first control signal, and an output; and a second multiplexer comprising an input coupled to the output of the first multiplexer, an input coupled to the first input, an input configured to receive a second control signal, and an output coupled to the data input of the latch.

14. The memory device of claim 13, wherein:

the first control signal is based on a state of the scan chain; and the second control signal is based on the state of the scan chain and the mode of operation of the memory device.

15. The memory device of claim 9, wherein the memory address storage module stores the memory test/repair data by configuring the plurality of latch components into a scan chain and scanning the memory test/repair data into the scan chain.

16. The memory device of claim 9, further comprising a memory array to reroute memory addresses associated with the faulty memory storage locations to alternate memory storage locations.

17. The memory device of claim 16, further comprising:

a fuse processor, wherein the memory array reroutes the memory addresses associated with the faulty memory storage locations further based on fuse states of the fuse processor.

18. The memory device of claim 16, further comprising:

an external test port coupled to the plurality of latch components, wherein the memory device is to configure the plurality of latch components into a scan chain and scan out the memory test/repair data to an external device via the external test port.

* * * * *